(12) United States Patent
Lin et al.

(10) Patent No.: US 9,390,521 B2
(45) Date of Patent: Jul. 12, 2016

(54) RAPID PARALLEL RECONSTRUCTION FOR ARBITRARY K-SPACE TRAJECTORIES

(75) Inventors: Wei Lin, Gainesville, FL (US); Feng Huang, Gainesville, FL (US); Miha Fuderer, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 60 days.

(21) Appl. No.: 13/996,031

(22) PCT Filed: Dec. 19, 2011

(86) PCT No.: PCT/IB2011/055765
§ 371 (c)(1),
(2), (4) Date: Jun. 20, 2013

(87) PCT Pub. No.: WO2012/085810
PCT Pub. Date: Jun. 28, 2012

(65) Prior Publication Data
US 2013/0279786 A1    Oct. 24, 2013

Related U.S. Application Data

(60) Provisional application No. 61/426,031, filed on Dec. 22, 2010.

(51) Int. Cl.
*G06K 9/00* (2006.01)
*G06T 11/00* (2006.01)
*G01R 33/561* (2006.01)
*G01R 33/48* (2006.01)

(52) U.S. Cl.
CPC .......... *G06T 11/005* (2013.01); *G01R 33/5611* (2013.01); *G01R 33/4824* (2013.01)

(58) Field of Classification Search
None
See application file for complete search history.

(56) References Cited

U.S. PATENT DOCUMENTS 6,954,067 B2   10/2005   Mistretta
7,309,984 B2   12/2007   Arunachalam
(Continued)

FOREIGN PATENT DOCUMENTS

CN   101308202 A   11/2008
JP   2002165776    11/2002

OTHER PUBLICATIONS

Lin et al (GRAPPA operator for wider radial band GROWL); 17th ISMRM meeting held Apr. 18-24, 2009.*
(Continued)

*Primary Examiner* — Nancy Bitar

(57) ABSTRACT

An imaging method comprises acquiring an undersampled magnetic resonance partially parallel imaging (MR-PPI) dataset using a plurality of radio frequency receive coils and reconstructing the undersampled MR-PPI dataset to generate a reconstructed magnetic resonance (MR) image. The reconstructing includes: (i) using a generalized auto-calibrating partially parallel acquisition (GRAPPA) operator or direct convolution to fill in at least some missing data of the undersampled MR-PPI dataset so as to generate an enhanced dataset; and (ii) using an algorithm other than a GRAPPA operator and other than direct convolution to reconstruct the enhanced dataset or to reconstruct the undersampled MR-PPI dataset using the enhanced dataset as an initialization dataset for an iterative reconstruction algorithm. In some embodiments the MR-PPI dataset is a non-Cartesian dataset and a GRAPPA operator for wider radial bands (GROWL) is used in the operation (i).

19 Claims, 15 Drawing Sheets

(56) References Cited

U.S. PATENT DOCUMENTS

| | | | |
|---|---|---|---|
| 7,319,324 B2 | 1/2008 | Kannengieber | |
| 7,330,027 B2 | 2/2008 | Kozerke | |
| 7,397,242 B2* | 7/2008 | Samsonov | G01R 33/5611 324/307 |
| 7,423,430 B1 | 9/2008 | Sharif | |
| 7,576,539 B2 | 8/2009 | Fu et al. | |
| 7,622,922 B2 | 11/2009 | Dannels | |
| 7,711,166 B2 | 5/2010 | Mistretta | |
| 7,777,487 B2 | 8/2010 | Ying | |
| 8,461,840 B2* | 6/2013 | Stemmer | 324/309 |
| 8,570,034 B2* | 10/2013 | Stemmer | 324/309 |
| 8,699,773 B2* | 4/2014 | Akcakaya | G06T 11/008 382/131 |
| 9,081,074 B2* | 7/2015 | Kwak | |
| 2002/0196706 A1* | 12/2002 | Kearney | 366/336 |
| 2005/0272997 A1 | 12/2005 | Grist | |
| 2007/0038073 A1* | 2/2007 | Mistretta | 600/410 |
| 2007/0280862 A1* | 12/2007 | Davis et al. | 422/141 |
| 2008/0285833 A1* | 11/2008 | Fu | G01R 33/5611 382/131 |
| 2008/0303521 A1 | 12/2008 | Beatty | |
| 2009/0105994 A1* | 4/2009 | Mandolini et al. | 703/1 |
| 2010/0239143 A1 | 9/2010 | Griswold | |

OTHER PUBLICATIONS

Huang, Feng et al "k-t GRAPPA: A k-Space Implementation for Dynamic MRI with High Reduction Factor", Magnetic Resonance in Medicine, vol. 54, 2005, pp. 1172-1184.

Breuer, F. et al "Dynamic Autocalibrated Parallel Imaging using TGRAPPA", Proc. Intl. Society Magnetic Resonance in Medicine, vol. 11, 2003, pp. 2330.

Huang, Feng et al "A Rapid and Robust Numerical Algorithm for Sensitivity Encoding with Sparsity Constraints: Self-Feeding Sparse SENSE", Magnetic Resonance in Medicine, vol. 64, 2010, pp. 1078-1088.

Jung, B.A. et al "Comparison of kt-SENSE and kt-GRAPPA applied to Cardiac Cine and Phase Contrast Imaging", Proc. Intl. Society Magnetic Resonance in Medicine, vol. 17, 2009, pp. 4559.

Jung, Hong et al "k-t FOCUSS: A General Compressed Sensing Framework for High Resolution Dynamic MRI", Magnetic Resonance in Medicine, vol. 61, 2009, pp. 103-116.

Kellermann, Walter "Strategies for Combining Acoustic Echo Cancellation and Adaptive Beamforming Microphone Arrays", IEEE, 1997, pp. 219-222.

Lai, P. et al, "Efficient L1SPIRiT Reconstruction (ESPIRiT) for Highly Accelerated 3D Volumetric MRI with Parallel Imaging and Compressed Sensing", Proc. Intl. Society Magnetic Resonance in Medicine, vol. 18, 2010, pp. 345.

Tsao, Jeffrey, et al "Optimizing Spatiotemporal Sampling for k-t BLAST and k-t SENSE: Application to High-Resolution Real-Time Cardiac Steady-State Free Precession", Magnetic Resonance in Medicine, vol. 53, 2005, pp. 1372-1382.

Lai P. et al kt SPIRiT for Ultra-Fast Cardiac Cine Imaging with Prospective or Retrospective Cardiac Gating. Proc. Intl. Society Magnetic Resonance in Medicine, vol. 18, 2010; Stockholm, Sweden. p. 482.

Lin, Wei et al "GRAPPA Operator for Wider Radial Bands (GROWL) with Optimally Regularized Self-Calibration", Magnetic Resonance in Medicine, vol. 64, No. 3, 2010, pp. 757-766.

Seiberlich, Nicole et al "Using the GRAPPA Operator and the Generalized Sampling Theorem to Reconstruct Undersampled Non-Cartesian Data", Magnetic Resonance in Medicine, vol. 61, No. 3, 2009, pp. 705-715.

Huang, F. et al "GRAPPA Operator Enhanced Initialization for Improved Multi-Channel Compressed Sensing", Proc. International Society for Magnetic Resonance in Medicine, vol. 19, 2011, p. 2860.

Griswold, Mark A. et al "Parallel Magnetic Resonance Imaging using the GRAPPA Operator Formalism", Magnetic Resonance in Medicine, vol. 54, No. 6, 2005, pp. 1553-1556.

Chen, Zhaolin et al "A Multistage Parallel Magnetic Resonance Image Reconstruction Method", Digital Image Computing Techniques and Applications, 2008, pp. 327-334.

Weller, D.S. et al "Combining Nonconvex Compressed Sensing and GRAPPA using the Nullspace Method", ISMRM—2010.

Seiberlich, Nicole et al "Reconstruction of Undersampled Non-Cartesian Data Sets using Pseudo-Cartesian GRAPPA in Conjunction with GROG" Magnetic Resonance in Medicine, vol. 59, 2008, pp. 1127-1137.

Zhao, Tiejun et al Iterative GRAPPA (iGRAPPA) for Improved Parallel Imaging Reconstruction, Magnetic Resonance in Medicine, vol. 59, 2008, pp. 903-907.

Pruessmann, Klaas P. et al "Advances in Sensitivity Encoding with Arbitrary k-Space Trajectories", Magnetic Resonance in Medicine, vol. 46, 2001, pp. 638-651.

Stehning, C. et al "Free-Breathing Whole-Heart Coronary MRA with 3D Radial SSFP and Self-Navigated Image Reconstruction", Magnetic Resonance in Medicine, vol. 54, 2005, pp. 476-480.

Rahmer, Juergen et al "Three-Dimensional Radial Ultrashort Echo-Time Imaging with T2 Adapted Sampling", Magnetic Resonance in Medicine, vol. 55, 2006, pp. 1075-1082.

Tao et al "Compressed Sensing Reconstuction With Retrospectively Gated Sampling Patterns for Velocity Measurement of Carotid Blood Flow" Proc. Intl. Soc. Mag Reson. Med 18 (2010) p. 4866.

King et al "A New Combination of Compressed Sensing and Data Driven Parallel Imaging" Proc. Intl. Soc. Mag. Reson. Med. 18, (2010) p. 4881.

* cited by examiner

RAPID PARALLEL RECONSTRUCTION FOR ARBITRARY K-SPACE TRAJECTORIES

CROSS-REFERENCE TO PRIOR APPLICATIONS

This application is the U.S. National Phase application under 35 U.S.C. §371 of International Application No. PCT/IB2011/055765, filed on Dec. 19, 2011, which claims the benefit of U.S. Provisional Patent Application No. 61/426,031, filed on Dec. 22, 2010. These applications are hereby incorporated by reference herein.

The following relates to the magnetic resonance imaging arts, medical imaging arts, and related arts.

Magnetic resonance (MR) imaging is a known medical imaging technique, which is also employed in veterinary imaging and other imaging applications such as characterizing archaeological artifacts. MR imaging has numerous advantages over other imaging techniques, such as not employing ionizing radiation, and providing diverse anatomical and functional contrast modes. In functional magnetic resonance imaging (fMRI), a contrast mode is employed that detects functional aspects. For example, in brain fMRI a contrast mode such as BOLD (blood oxygen level dependence) is employed that provides contrast indirectly related to neural activity. In magnetic resonance angiography (MRA), a technique that provides blood contrast is employed. In some MRA approaches an exogenous magnetic contrast agent is injected into the bloodstream.

These various dynamic MR imaging techniques impose strict time constraints on the image acquisition time. Fast MR imaging is also advantageous for other reasons, such as reducing motion artifacts and increasing efficiency of MR laboratories. Toward this end, fast MR imaging techniques such as ultra-short echo time (UTE) techniques have been developed. However, imaging can still take of order several minutes, to tens of minutes, or longer.

Another approach for achieving more rapid MR imaging data acquisition are the class of imaging techniques known as partially parallel imaging (PPI). Examples of PPI techniques include sensitivity encoding (SENSE), simultaneous acquisition of spatial harmonics (SMASH), generalized autocalibrating partially parallel acquisition (GRAPPA), or so forth. In these techniques, a plurality of radio frequency receive coils having different coil sensitivities acquire an undersampled MR imaging dataset that is missing some data (for example, skipping acquisition of some phase encoding lines as is done in SENSE). The missing data are compensated by additional information provided by the use of a plurality of receive coils with different coil sensitivities, using a suitable reconstruction technique (e.g., a SENSE or SMASH reconstruction technique). The undersampling of the acquired PPI dataset corresponds to an imaging data acquisition acceleration factor (typically denoted R) whose magnitude depends upon the extent of undersampling. In general, a more undersampled dataset can be acquired faster, but at the potential cost of introducing image artifacts due to the undersampling.

The following provides new and improved apparatuses and methods as disclosed herein.

In accordance with one disclosed aspect, a method comprises acquiring an undersampled magnetic resonance partially parallel imaging (MR-PPI) dataset using a plurality of radio frequency receive coils and reconstructing the undersampled MR-PPI dataset to generate a reconstructed magnetic resonance (MR) image. The reconstructing includes: (i) using a generalized auto-calibrating partially parallel acquisition (GRAPPA) operator or direct convolution to fill in at least some missing data of the undersampled MR-PPI dataset so as to generate an enhanced dataset comprising the undersampled MR-PPI dataset and missing data that is filled in by the operation (i); and (ii) using an algorithm other than a GRAPPA operator and other than direct convolution to reconstruct the enhanced dataset or to reconstruct the undersampled MR-PPI dataset using the enhanced dataset as an initialization dataset for an iterative reconstruction algorithm.

In accordance with other disclosed aspects, in a method as set forth in the immediately preceding paragraph the acquiring comprises acquiring an undersampled MR-PPI dataset including a central k-space region including k=0 that is not undersampled, an intermediate k-space region surrounding the central k-space region that is undersampled at a first acceleration factor R1, and an outer k-space region surrounding the intermediate k-space region that is undersampled at a second acceleration factor R2 where R2>R1. The performance of the operation (i) may precede performance of the operation (ii). In another method as set forth in the immediately preceding paragraph, the acquiring comprises acquiring an undersampled k-t MR-PPI dataset over a plurality of time frames that includes a central k-space region including k=0 that is not undersampled, an intermediate k-space region surrounding the central k-space region that is undersampled at a first acceleration factor R1, and an outer k-space region surrounding the intermediate k-space region that is undersampled at a second acceleration factor R2 where R2>R1.

In accordance with another disclosed aspect, a method comprises acquiring an undersampled non-Cartesian magnetic resonance partially parallel imaging (MR-PPI) dataset using a plurality of radio frequency receive coils, and reconstructing the undersampled non-Cartesian MR-PPI dataset to generate a reconstructed magnetic resonance (MR) image, wherein the reconstructing uses a generalized auto-calibrating partially parallel acquisition (GRAPPA) operator for wider radial bands (GROWL) to fill in at least some missing data of the undersampled non-Cartesian MR-PPI dataset.

In accordance with other disclosed aspects, in a method as set forth in the immediately preceding paragraph the acquiring comprises acquiring an undersampled non-Cartesian k-t MR-PPI dataset over a plurality of time frames, the undersampling being different in adjacent time frames to produce undersampling along the time dimension, and the reconstructing uses GROWL to fill in at least some missing data due to the undersampling along the time dimension.

In accordance with another disclosed aspect, any of the methods set forth in the immediately preceding four paragraphs may further include displaying the reconstructed MR image on a display device. In accordance with another disclosed aspect, an apparatus comprises a magnetic resonance (MR) scanner, a plurality of radio frequency receive coils, and a data processing device configured to cooperate with the MR scanner and the radio frequency receive coils to perform one or more of the methods set forth in the immediately preceding four paragraphs. In accordance with another disclosed aspect, a storage medium stores instructions executable by a magnetic resonance (MR) imaging system to perform one or more of the methods set forth in the immediately preceding four paragraphs.

One advantage resides in providing magnetic resonance partially parallel imaging (MR-PPI) with reduced image artifacts.

Another advantage resides in providing MR-PPI with an enhanced net acceleration factor corresponding to faster dataset acquisition.

Further advantages will be apparent to those of ordinary skill in the art upon reading and understanding the following detailed description.

FIG. 1 diagrammatically shows an imaging system configured to perform magnetic resonance partially parallel imaging (MR-PPI) as disclosed herein.

FIG. 2 diagrammatically shows a radial MR-PPI dataset suitably acquired by the imaging system of FIG. 1 and processed by the control module of FIG. 1 to apply GROWL to the radial MR-PPI dataset.

FIG. 3 diagrammatically shows a spiral MR-PPI dataset suitably acquired by the imaging system of FIG. 1 and processed by the control module of FIG. 1 to apply GROWL to the spiral MR-PPI dataset.

Figure 1:
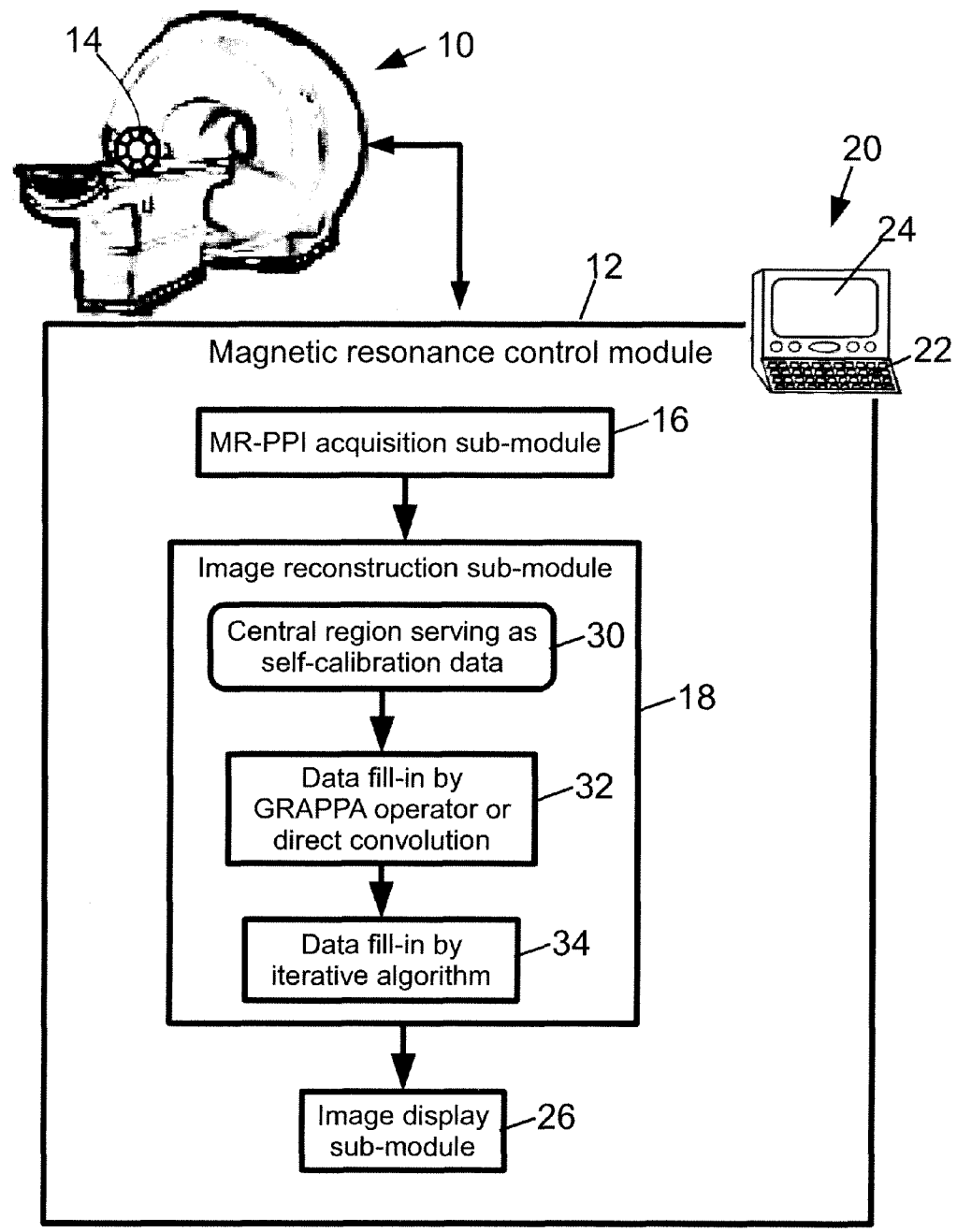

With reference to FIG. 1, an imaging system includes a magnetic resonance (MR) scanner 10, such as an illustrated Achieva™ MR scanner (available from Koninklijke Philips Electronics N.V., Eindhoven, The Netherlands), or an Intera™ or Panorama™ MR scanner (both also available from Koninklijke Philips Electronics N.V.), or another commercially available MR scanner, or a non-commercial MR scanner, or so forth. In a typical embodiment, the MR scanner includes internal components (not illustrated) such as a superconducting or resistive main magnet generating a static ($B_0$) magnetic field, sets of magnetic field gradient coil windings for superimposing selected magnetic field gradients on the static magnetic field, a radio frequency excitation system for generating a radio frequency ($B_1$) field at a frequency selected to excite magnetic resonance (typically $^1H$ magnetic resonance, although excitation of another magnetic resonance nuclei or of multiple magnetic resonance nuclei is also contemplated), and a radio frequency receive system including a radio frequency receive coil array, or a plurality of receive coils, for detecting magnetic resonance signals emitted from the subject.

The MR scanner 10 operates under control of a magnetic resonance (MR) control module 12 to perform magnetic resonance partially parallel imaging (MR-PPI). In MR-PPI, an undersampled imaging dataset is acquired by a plurality of magnetic resonance receive channels, for example including radio frequency receive coils of a diagrammatically illustrated receive coil array 14. In MR-PPI, a plurality of receive coils having different coil sensitivities acquire an undersampled MR imaging dataset that is missing some data (for example, skipping acquisition of some phase encoding lines as is done in SENSE). The missing data are compensated by additional information provided by the use of a plurality of receive coils with different coil sensitivities, using a suitable reconstruction technique (e.g., a SENSE or SMASH reconstruction technique). The undersampling of the acquired PPI dataset corresponds to an imaging data acquisition acceleration factor (typically denoted R) whose magnitude depends upon the extent of undersampling. In the diagrammatically illustrated control module 12, acquisition of the undersampled MR-PPI dataset is under the control of an MR-PPI acquisition sub-module 16, and the image reconstruction is performed by an image reconstruction sub-module 18.

The MR control module 12 is suitably embodied by an illustrative computer 20 or other digital processing device employing a multi-core processor or other parallel processor, a single-core processor, a graphical processing unit, i.e. GPU, or so forth and having a communication bus or other operative connection with the MR scanner 10 to cause the MR scanner 10 to perform the MR-PPI dataset acquisition. While the digital processing device employs a digital processor, it is also contemplated for the digital processing device to include or have access to some analog circuitry, such as by way of illustrative example application-specific integrated circuitry (ASIC) configured to perform some or all of the image reconstruction processing of the image reconstruction sub-module 18. The disclosed MR-PPI techniques may also be embodied as a storage medium storing instructions that when executed by a processor of the digital processing device 20 perform the disclosed MR-PPI operations. For example, the storage medium may comprise a hard drive, optical drive, random access memory (RAM), FLASH memory, or other electrostatic memory, various combinations thereof, or another suitable storage medium.

The imaging system typically also includes an illustrative keyboard 22 or other user input device (e.g., a mouse, trackball, or other pointing device) via which a user inputs commands, parameters, or so forth for initiating and controlling the imaging process. The reconstructed MR image generated by the image reconstruction module 18 is suitably displayed on a display device such as an illustrative display device 24 of the illustrative computer 20. Toward this end, the illustrative MR control module 12 includes or implements an image display sub-module 26 that performs suitable rendering of the reconstructed MR image such as generating a three-dimensional rendering, or extracting a two-dimensional slice, or forming a maximum intensity projection (MIP), or generating a cine sequence of images acquired over a sequence of time frames, or so forth, and the rendering generated by the display sub-module 26 is displayed on the display device 24. Additionally or alternatively, the reconstructed MR image may be stored in a memory or storage device, communicated via a hospital network or the Internet, or otherwise utilized (these additional/alternative options not illustrated in FIG. 1).

With continuing reference to FIG. 1, in MR-PPI techniques disclosed herein, a combination of (1) the arrangement of the missing data (that is, the undersampling) and (2) the methodology for filling in the missing data is designed to provide substantially faster imaging data acquisition (corresponding to a high net acceleration factor R over the complete dataset acquisition) with generally reduced image artifacts as compared with existing techniques. Some such disclosed techniques employ a GRAPPA operator for wider radial bands (GROWL) to extend the benefits of the GRAPPA operator to undersampled radial, spiral, or other non-Cartesian datasets. As disclosed herein, this can have the benefit of providing built-in self-calibration data in the form of a central k-space region (including k=0) 30 that is not undersampled, and that can be used for calibrating GROWL. The availability of this self-calibration data is a natural result of the radial lines of a radial or spiral dataset converging at k=0. In the case of a Cartesian MR-PPI dataset, the central k-space region including k=0 may optionally be fully sampled to provide self-calibration data built into the Cartesian MR-PPI dataset. In yet other contemplated embodiments, the self-calibration data is acquired before acquisition of the MR-PPI dataset.

In an operation 32 implemented by the reconstruction sub-module 18, a GRAPPA operator (which may be embodied by GROWL in the case of a non-Cartesian MR-PPI dataset), or another interpolation technique such as direct convolution using a suitable convolution kernel, is used to fill in missing data of the undersampled MR-PPI dataset. The operation 32 uses the built-in self-calibration data 30 for calibration. In some embodiments, the GRAPPA operator, GROWL, or direct convolution fills all missing data of the undersampled MR-PPI dataset to generate an enhanced dataset comprising the undersampled MR-PPI dataset and the filled in data. In such embodiments, a reconstruction algorithm 34 (which is not a GRAPPA operator and is not direct convolution) is used to reconstruct the enhanced dataset, or is used to reconstruct the undersampled MR-PPI dataset using the enhanced dataset as an initialization dataset for an iterative reconstruction algorithm.

In other embodiments, however, the operation 32 fills in only some, but not all, missing data of the undersampled MR-PPI dataset. These embodiments recognize that techniques such as GROWL are highly effective for filling in missing data over a short range, that is, when the missing datum is close to an acquired datum or acquired data in the k-space. However, techniques such as GROWL are less effective for filling in missing data over a longer range, that is, when the missing datum is relatively far away from any acquired datum or acquired data in the k-space. In these embodiments, the operation 32 comprises a GRAPPA operator (which, as used herein, encompasses GROWL) that fills in data in an intermediate k-space region surrounding the central region, while the algorithm 34 (which, again, is other than a GRAPPA operator and other than direct convolution) is used to perform the reconstruction including filling in missing data in an outer k-space region surrounding the intermediate k-space region. In some such embodiments, the intermediate k-space region is undersampled at a first acceleration factor R1 while the outer k-space region is undersampled at a second acceleration factor R2 where R2>R1. Moreover, in some such embodiments the reconstruction algorithm 34 employs at least the intermediate k-space region with missing data filled in by the GRAPPA operator as self-calibration data. Optionally, the reconstruction algorithm 34 may employ the combination of the central k-space region 30 and the intermediate k-space region with missing data filled in by the GRAPPA operator or direct convolution operation 32 as the self-calibration data.

The reconstruction algorithm 34 may employ a Fourier transform reconstruction, an iterative reconstruction technique, or so forth. The operations 32, 34 may be integrated in various ways. For example, the operation 32 may be performed in k-space or in image space. In iterative reconstruction approaches, it is contemplated to perform one or more iterations with only the acquired MR-PPI dataset so as to generate an initial estimated image, and then to apply the operation 32 to fill-in missing data, which is then followed by further iterations of the iterative reconstruction algorithm. The operation 34 may reconstruct the enhanced dataset comprising the undersampled MR-PPI dataset and the filled in data to form the reconstructed image. Alternatively, the operation 34 may iteratively reconstruct the undersampled MR-PPI dataset, and make use of the enhanced dataset comprising the undersampled MR-PPI dataset and the filled in data as an initialization dataset for an iterative reconstruction algorithm.

Figure 2:
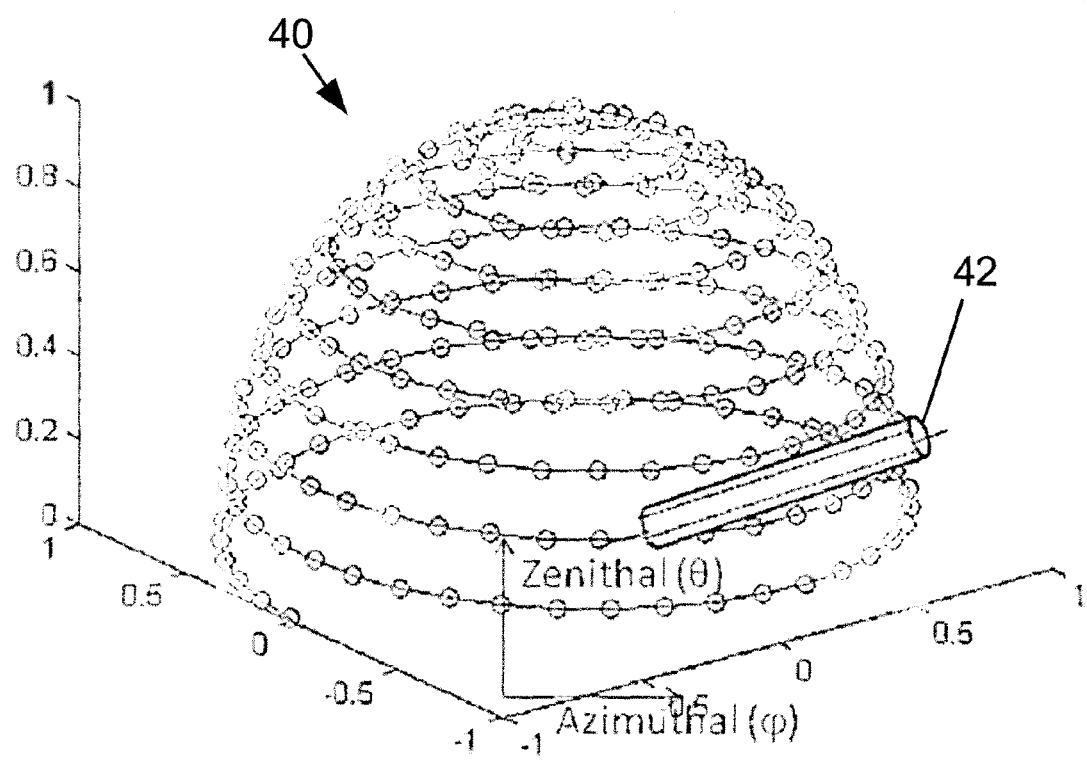

With continuing reference to FIG. 1 and further reference to FIG. 2, an embodiment for reconstructing a radial MR-PPI dataset which employs GROWL in the operation 32 is described. In this embodiment the operation 32 uses the GRAPPA extrapolation operator to widen each radial line into a rod consisting of several parallel lines. Self-calibration is achieved using the central k-space region 30, where Nyquist criterion is satisfied. Using this approach, reconstruction times of an hour or longer for existing radial parallel imaging reconstruction methods can be reduced to a time of order 5-10 minutes. By way of illustrative example, FIG. 2 diagrammatically shows a three-dimensional (3D) radial trajectory 40. Data are acquired along radial lines in k-space, but at an angular rate lower than that necessary to satisfy the Nyquist sampling criterion. During the reconstruction phase, the GRAPPA operator for wider radial bands (GROWL) is used to expand each radial line into a rod 42 consisting of several parallel k-space lines. Since data near the central k-space is fully sampled, it can be used as the self-calibration data 30 (see FIG. 1).

In a suitable approach for filling in missing data using GROWL, the GRAPPA relative shift operator is used to expand each radial line into the rod or k-space segment 42 consisting of m parallel k-space lines. The central k-space region 30 corresponds to a Nyquist circle (or sphere) within which the sampling satisfies the Nyquist sampling criterion. This central k-space region 30 is used for calibration. In an illustrative example, an optimal Tikhonov regularization factor is introduced to minimize the error introduced by GRAPPA relative shift operator. Let t and S be the vector of target and the matrix of source data points from multiple k-space locations and coil channels. Let w be the weight vector for the GRAPPA relative shift operator. During the calibration process, weight vector w is determined by solving the overdetermined linear equation $t_{ACS}=S_{ACS}$ w where the subscript ACS denotes the auto-calibration signal (i.e., the central k-space region 30). The subscript ACS indicates that both target and source data points are collected in the ACS region 30. A suitable method for solving the linear equation $t_{ACS}=S_{ACS}w$ is the linear least square approach, which seeks to minimize the residual error $w_0=\arg\min_w(\|t_{ACS}-S_{ACS}w\|^2)$ where the notation $\|\ldots\|$ denotes the $L_2$ norm. The optimal weight vector, however, should minimize the error over the entire k-space, that is, $w_{opt}=\arg\min_w(\|t_E-S_E w\|^2)$ where here the subscript E indicates that both target and source data points are collected in the entire k-space. In other words, the ideal weight vector is the solution to following equation: $t_E=S_E$ w. However, since only $S_E$ is known, this equation cannot be solved. Instead, Tikhonov regularization is used to solve the equation $t_{ACS}=S_{ACS}$ w by minimizing $w_{opt}=\arg\min_w\{\|t_{ACS}-S_{ACS}w\|^2+\lambda^2\|w\|^2\}$ where $\lambda$ is known as the Tikhonov factor. A solution to this equation is $$w_{opt} = \sum_{j=1}^{n} \frac{s_j}{s_j^2+\lambda^2} u_j^H t v_j$$

where $u_j$, $v_j$, and $s_j$ are the left singular vectors, right singular vectors, and singular values of S, respectively, generated by singular value decomposition, with singular vectors and singular values indexed by j.

In a suitable approach for implementing the data fill-in operation 32, the data within the central k-space region 30 (which is a Nyquist circle or sphere in this case) are first regridded from the acquired radial lines onto a Cartesian grid. For each radial readout line, a shearing method is used to rotate the regridded Cartesian dataset to align with the readout line. The GRAPPA relative shift operator weights are then computed from this calibration region and used to expand each readout line into a wider band. Alternatively, a Cartesian target point near the acquired readout line is directly determined using a convolution kernel.

Figure 3:
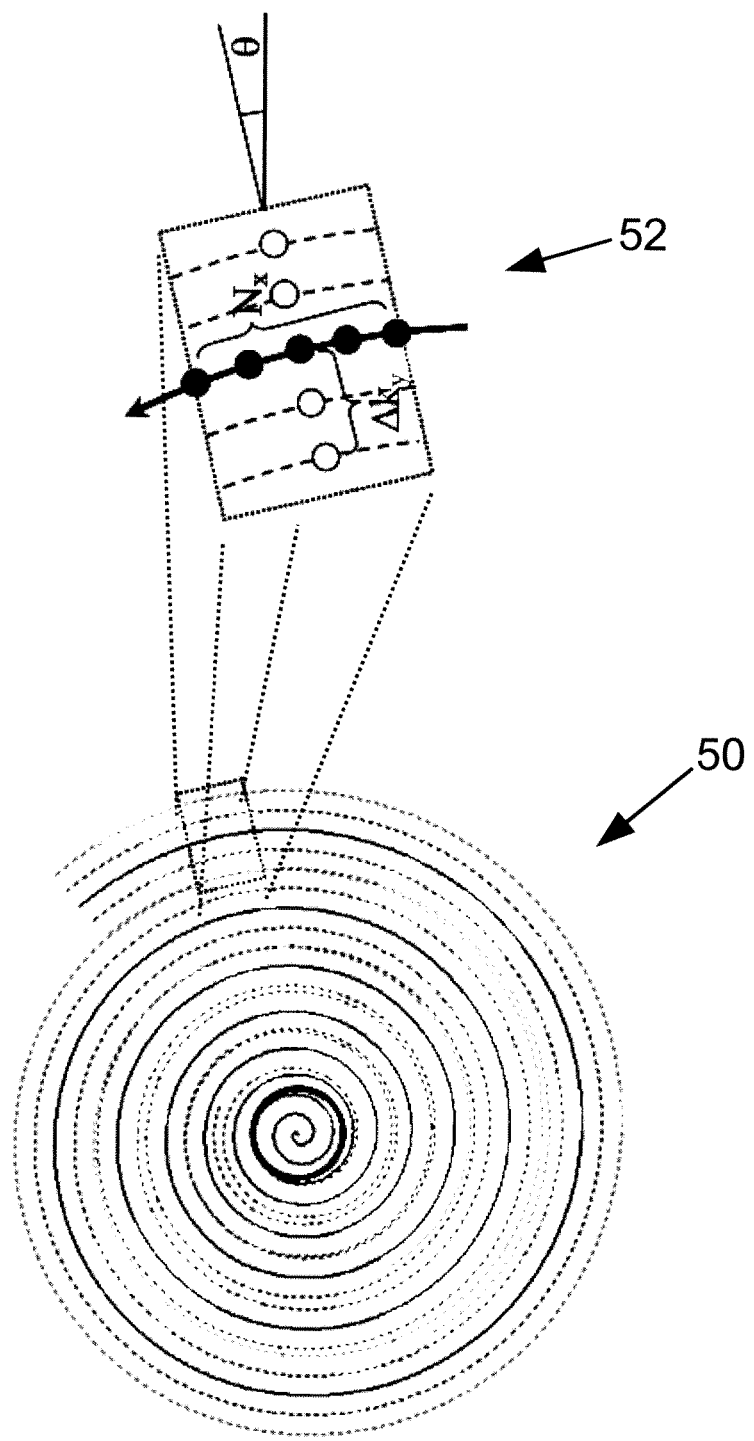

With continuing reference to FIG. 1 and further reference to FIG. 3, an embodiment for reconstructing a spiral MR-PPI dataset 50 employs GROWL in the operation 32. The approach is based on the following observations. Since any MR scanner has a finite gradient slew rate, the readout line of any trajectory has a finite curvature. To a first degree approximation, data points on a readout line lie out linearly. The operation 32, which in this embodiment is a GROWL operator, is a convolution kernel combining multiple adjacent source points from multiple channel elements. The GROWL operator can therefore be used to estimate a target point farther away (typically 1-3/FOV, depending on coil and noise level) from the source readout lines. This is shown in an inset 52 of FIG. 3 for the spiral trajectory 50. Three parameters that determine a GROWL operator are: the number of the source point $N_x$, the distance of the target point from the source readout line $\Delta k_y$, and the orientation $\theta$. For a given coil configuration, $N_x$ can be fixed and an array of GROWL operators with a discrete sets of different $\Delta k_y$ and $\theta$ can be pre-calibrated and later used. The calibration of the GROWL operator can be performed either using fully-sampled k-space (e.g. for radial and variable-density spiral), or a separate sensitivity mapping scan.

The method of FIG. 2 or of FIG. 3 can be implemented as follows: each readout line is expanded into a wider band. The target points remain on the non-Cartesian grid. Then a regridding procedure is used to render final reconstruction. In an alternative implementation, the Cartesian target point near the acquired readout line is directly determined using a convolution kernel. This is called direct convolution herein. For radial and spiral trajectories, many convolution kernels are necessary to extrapolate data to different angles. Since the distance $\Delta k_y$ could be an arbitrary value, two kernels with the nearest $\Delta k_y$ values can be interpolated to derive the desired kernel values for reduced calculation time.

Figure 4:
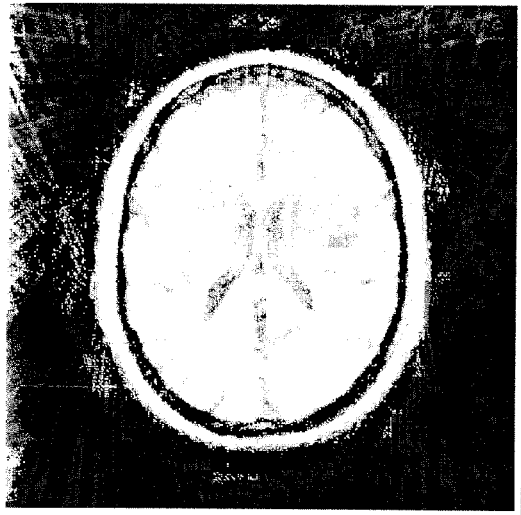
FIG. 4 shows a radial imaging example with direct reconstruction of an undersampled radial dataset onto a Cartesian grid using GROWL operators.
Figure 4:
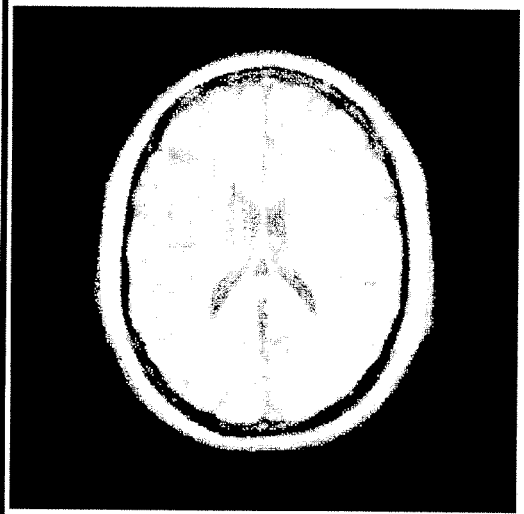
Figure 4:
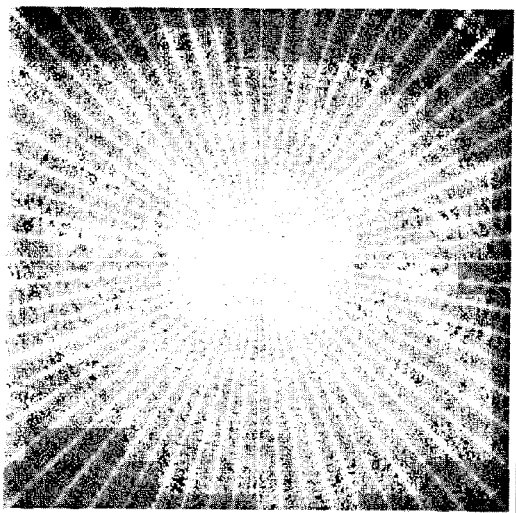
Figure 4:
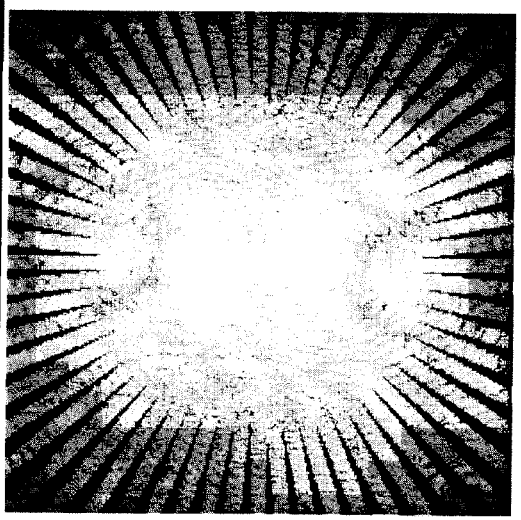

FIG. 4 shows a radial example with direct reconstruction of an undersampled radial dataset (8-channel coil, 32 views, 256×256 matrix size) onto a Cartesian grid using GROWL operators. The left side shows the result after regridding to the Cartesian grid, while the right side shows the result after applying the GROWL operators. The top images are the reconstructed MR images, while the bottom images show magnitude of corresponding k-space on a logarithmic scale.

GROWL is a fast reconstruction technique due to the small kernel size and typically small calibration regions. In experiments, both radial and spiral images were reconstructed within 10 seconds on a 3.0 GHz personal computer (PC). The performance of GROWL operator can be further improved by considering the curvature of the readout line and applying different regularization at different regions of k-space (that is, replacing $t_E$ and $S_E$ corresponding to collecting respective target and source data points in the entire k-space with values for selected regions of k-space such that the curvature is relatively uniform in each selected region).

The foregoing illustrative examples of FIGS. 2-4 employ the data fill-in operation 32 using GROWL as the only data fill-in operation. In the following examples, the data fill-in operation 32 fills in some missing data, while additional missing data is filled in using a different technique, which may use the result of GROWL as self-calibration data.

Figure 5:
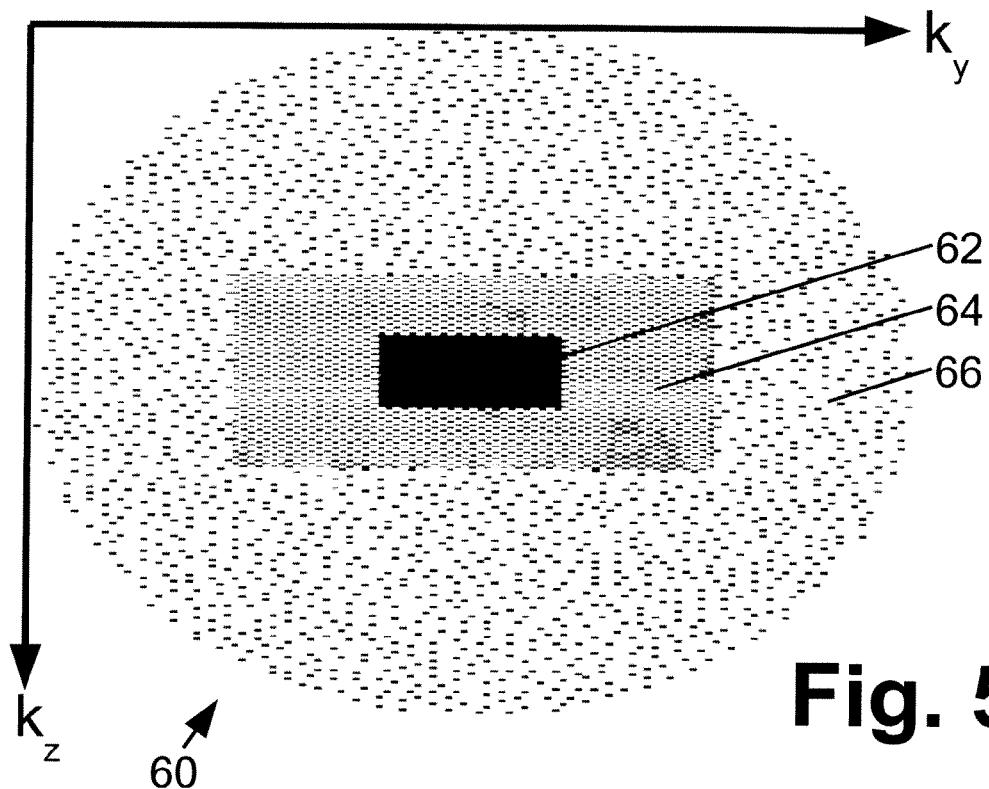
FIGS. 5-11 show illustrative examples in which the imaging system of FIG. 1 processes an MR-PPI dataset using a GRAPPA operator and multichannel compressed sensing.

With continuing reference to FIG. 1 and with further reference to FIGS. 5-11, illustrative examples are described in which the operation 32 employs the GRAPPA operator and the reconstruction algorithm 34 employs multichannel compressed sensing. These examples use the GRAPPA operator in the operation 32 to fill in missing data and optionally to improve the initialization for the reconstruction algorithm 34 employing compressed sensing (or, more generally, an iterative reconstruction). As seen in FIG. 5, this is suitably done in conjunction with a k-space trajectory or dataset 60 having three density levels chosen to balance high acceleration factor and image quality. The illustrative acquired MR-PPI dataset 60 includes three regions: a central k-space region 62 including k=0 that is not undersampled; an intermediate k-space region 64 surrounding the central k-space region 62 that is undersampled at a first acceleration factor R1; and an outer k-space region 66 surrounding the intermediate k-space region 64 that is undersampled at a second acceleration factor R2 where R2>R1 (that is, the outer region 66 is more sparsely sampled, or more undersampled, than the intermediate region 64). In the illustrative embodiment, R1=2 and the intermediate region 64 is sampled using a checkerboard pattern, and R2>2 and the outer region 66 corresponds to a Poisson disk trajectory. In FIG. 5 the $k_x$ direction is perpendicular to the paper. The central k-space region 62 is a 24×24 region and has R=1 (that is, not undersampled). The intermediate k-space region 64 is a 64×64 region and has R1=2 with checker board pattern. The outer k-space region 66 has R2=9 with a Poisson disk trajectory.

Figure 6:
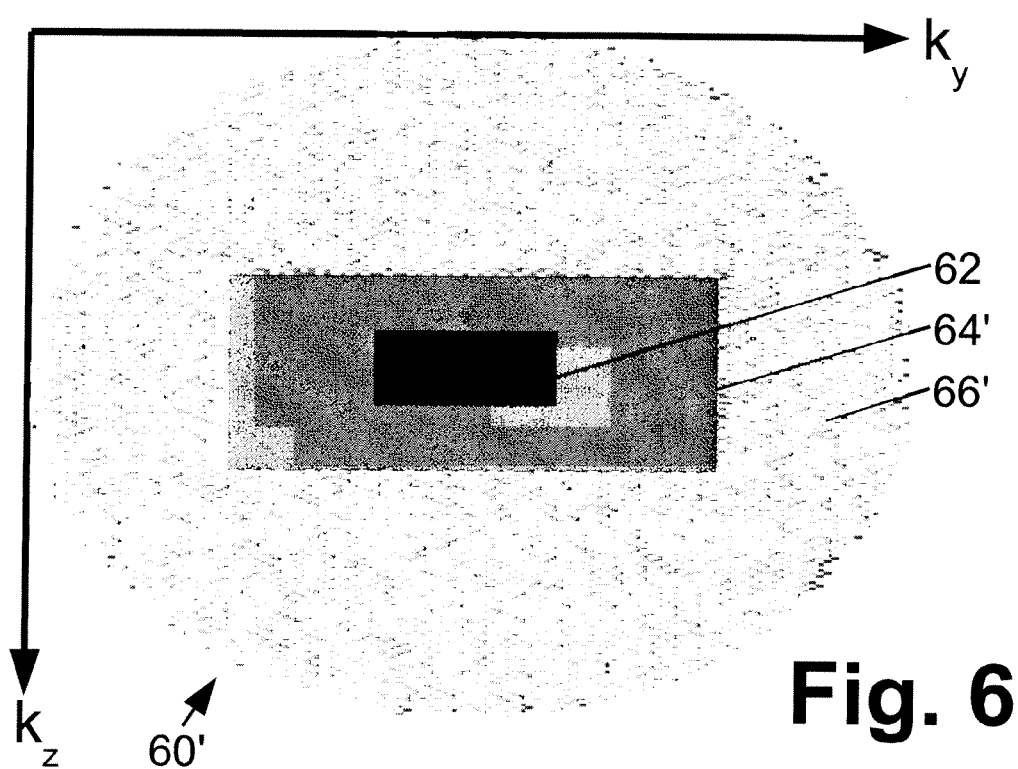

FIG. 6 shows a k-space trajectory or dataset 60' corresponding to the k-space trajectory or dataset 60 of FIG. 5 after application of the operation 32 employing a GRAPPA operator. The GRAPPA operator is used to extend each $k_x$ line to be at least 5 lines. The extrapolation is along $k_y$ and $k_z$ direction. The kernel size can be as small as 1 point from each channel, although larger kernel sizes are also contemplated. This operation 32 is fast because the size of convolution kernel is small. Moreover, due to further missing data fill-in provided in these embodiments by the reconstruction algorithm 34, it is not necessary to approximate all unacquired k-space data. The k-space trajectory or dataset 60' of FIG. 6 is an enhanced dataset 60' comprising the undersampled MR-PPI dataset 60 and missing data that is filled in by the operation 32, which in this embodiment employs a GRAPPA operator. In the enhanced dataset 60', the central k-space region 62 was fully sampled during the acquisition, and is not modified by the GRAPPA operator rather, the central k-space region 62 is used as self-calibration data in applying the GRAPPA operator. The intermediate k-space region 64 having R1=2 as acquired is converted to an enhanced intermediate k-space region 64' having R1'=1 by application of the GRAPPA operator. Thus, the enhanced intermediate k-space region 64' is no longer undersampled, and can be used in calculating sensitivity maps for the iterative reconstruction algorithm 34. Application of the GRAPPA operator in the outer k-space region 66 having R2=9 produces an enhanced outer k-space region 66' that has some missing data filled in but remains undersampled such that R2' remains greater than unity.

In the embodiment of FIGS. 5-11 the iterative reconstruction algorithm 34 is suitably a type of compressed sensing. In some embodiments, referred to herein as "strong" approach, the reconstruction algorithm 34 reconstructs the enhanced dataset 60' (see FIG. 6) comprising the undersampled MR-PPI dataset 60 (see FIG. 5) and missing data that is filled in by the operation 32 utilizing the GRAPPA operator. This approach is preferable if the GRAPPA operator accuracy is deemed to be high. In these embodiments the result of the GRAPPA operator is treated the same way as acquired data, and is used in the fidelity term of the compressed sensing or other reconstruction minimization equation.

In other embodiments, referred to herein as the "weak" approach, the reconstruction algorithm 34 reconstructs the undersampled MR-PPI dataset 60 (see FIG. 5) and uses the enhanced dataset 60' (see FIG. 6) comprising the undersampled MR-PPI dataset and missing data that is filled in by the operation 32 utilizing the GRAPPA operator for initializing the iterative reconstruction. This approach is preferable if the GRAPPA operator accuracy is deemed to be less high. In these embodiments the result of GRAPPA operator is only used to enhance the initialization of the reconstruction iteration.

The accuracy of the GRAPPA operator is suitably assessed based on the coil geometry and the size of the convolution kernel. Thus, the choice between the strong or weak approach to handling the results of the GRAPPA operator can be made before performing the reconstruction. Using and eight-channel head coil available from Invivo Corp. Gainesville, Fla. as an example, the strong approach is suitable if the phase encoding direction is either left-right or anterior-posterior and three or more source points from the same slice of each channel data are used. On the other hand, the weak approach is suitable if only one source point is used from each coil element.

In the embodiments of FIGS. 5-11, compressed sensing or self-feeding sparse SENSE is suitably employed in the reconstruction algorithm 34, using the result of GRAPPA operator obtained in the operation 32 as initialization. If the coils provide spatial encoding ability along all three directions, then a 5×1 kernel can be used in the operation 32. Moreover, the result of GRAPPA operator can optionally be used in fidelity term of self-feeding Sparse SENSE (strong approach only), as well as the improved initialization (both strong and weak approaches).

Figure 7:
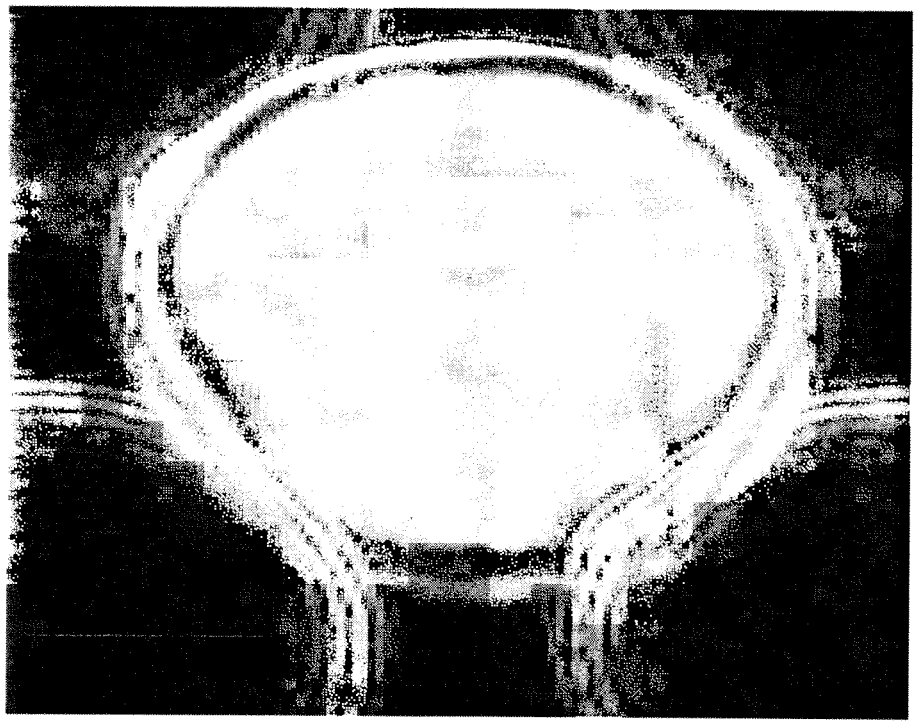
Figure 8:
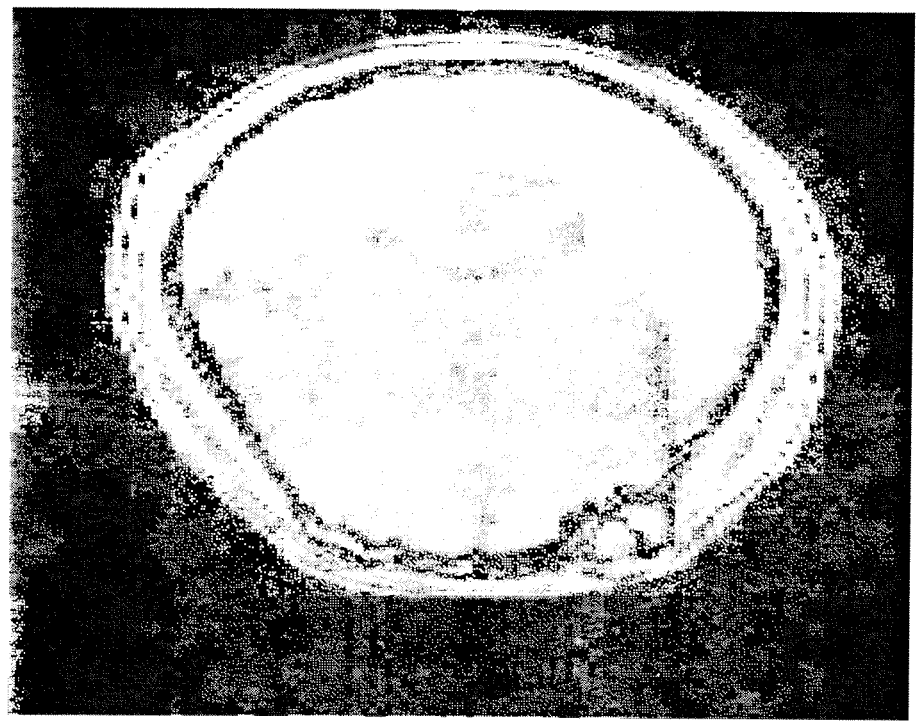

With reference to FIGS. 7 and 8, reconstructed MR images are shown corresponding to reconstruction of the datasets 60, 60' of FIGS. 5 and 6, respectively. The image quality is seen to be significantly improved with the GRAPPA operator (FIG. 8 and dataset 60' of FIG. 6) as compared to without the GRAPPA operator (FIG. 7 and dataset 60 of FIG. 5). Hence, the result of GRAPPA operator (FIG. 8) is a better initialization than FIG. 7 for self-feeding Sparse SENSE.

Figure 9:
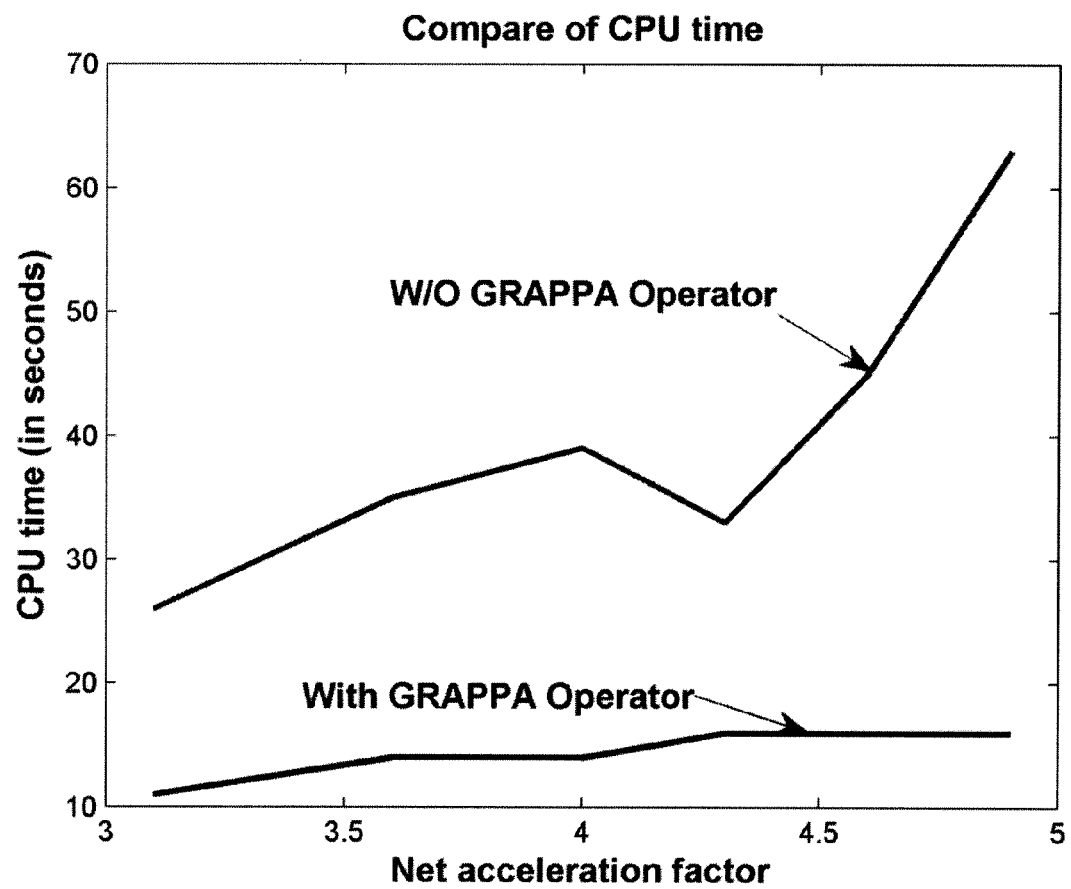
Figure 10:
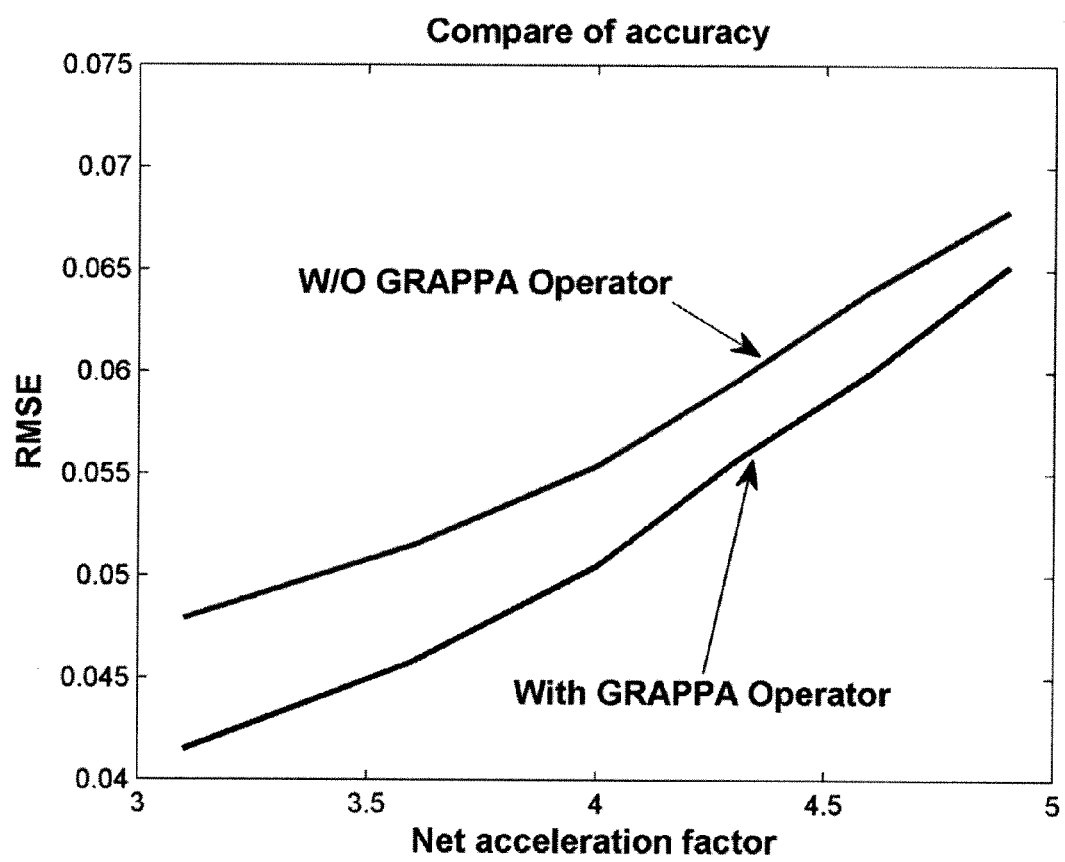

With reference to FIGS. 9 and 10, comparison is shown of performance of self-feeding Sparse SENSE with and without GRAPPA operator for initialization. FIG. 9 shows the CPU time comparison (that is, computational speed) while FIG. 10 shows the accuracy comparison. In the imaging results plotted in FIGS. 9 and 10, the result of GRAPPA operator was used in the weak approach, that is, only to improve the initialization. FIG. 9 shows the convergence speed can be up to four times faster when net acceleration factor is close to 5. FIG. 10 shows the accuracy is also consistently improved with the GRAPPA operator enhanced initialization.

Figure 11:
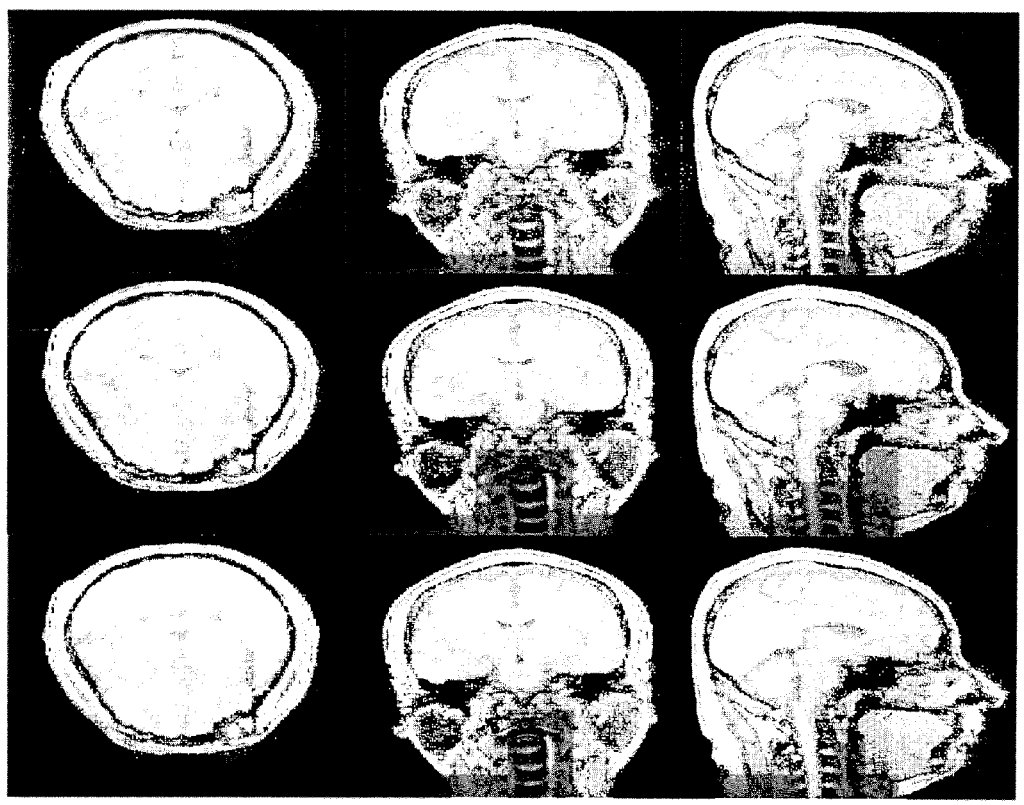

With respect to FIG. 11, the combination of the operation 32 employing the GRAPPA operator (or GROWL in the case of non-Cartesian data) and compressed sensing as disclosed herein can significantly reduce the MR data acquisition time for high resolution 3D imaging. For a 256×227×8×115 data set, the acquisition time can take close to 10 minutes by using 3D FFE sequence on a Philips MR scanner. By using the disclosed approach, the acquisition time can be reduced to 2 minutes without substantial image degradation. FIG. 11 illustrates this. The top row of FIG. 11 shows high resolution 3D image acquired using an eight-channel head coil with an acquisition time of 10 minutes. The middle row shows reconstruction by the disclosed method with an MR-PPI dataset including only 25% sampling (75% of data not sampled), which means the acquisition time can be reduced to 2.5 minutes. The bottom row shows reconstruction by the disclosed method with an MR-PPI dataset including only 20% sampling (80% of data not sampled), which means the acquisition time can be reduced to 2 minutes. As seen in FIG. 11, the image quality is not substantially degraded for these highly accelerated MR-PPI acquisitions.

While the illustrative embodiment of FIGS. 5-11 employs Cartesian MR-PPI datasets and the GRAPPA operator, extension to non-Cartesian MR-PPI datasets using a GRAPPA operator for wider radial bands (GROWL) is straightforward. Moreover, a technique such as direct convolution can be used in place of the GRAPPA operator.

Figure 12:
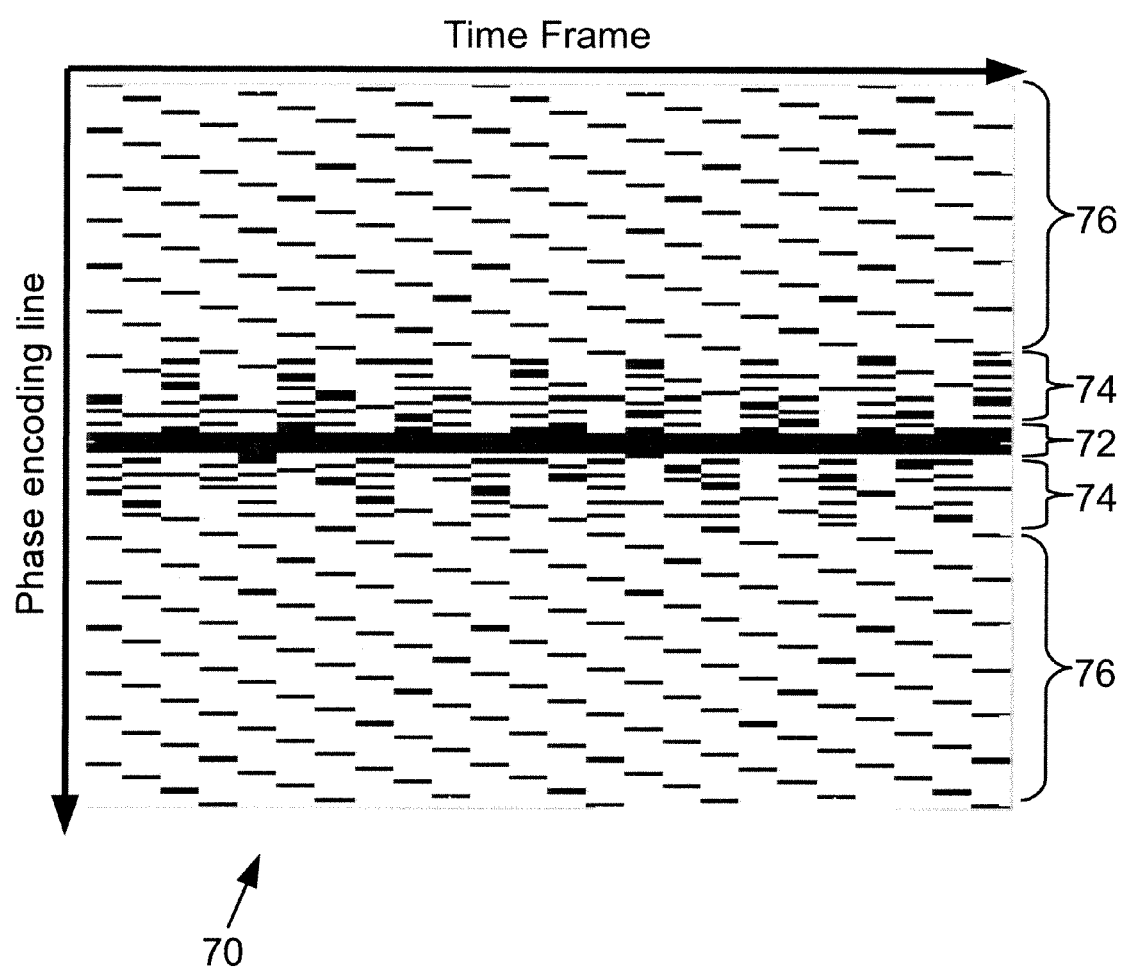
FIGS. 12-17 show illustrative examples in which the imaging system of FIG. 1 processes a dynamic (k-t) MR-PPI dataset using GROWL and temporal filtering.

With reference to FIGS. 12-17, illustrative examples are described in which the approach of FIGS. 5-11 is adapted for dynamic imaging over a sequence of succeeding time frames. As seen in FIG. 12, the approach uses a k-t trajectory or dataset 70 having three density levels. A central k-space region 72 including k=0 is not undersampled (i.e., has acceleration factor R=1). This region may, for example, comprise five lines around the center of k-space. An intermediate k-space region 74 surrounding the central k-space region 72 is undersampled at a first acceleration factor R1. In some embodiments R1=3 and the region has a width of 20 lines, although other values are contemplated. An outer k-space region 76 surrounding the intermediate k-space region 74 is undersampled at a second acceleration factor R2 where R2>R1 (that is, the outer region 76 is more sparsely sampled, or more undersampled, than the intermediate region 74). In some embodiments the outer region 76 is sampled using a trajectory or pattern as described in Tsao et al., "Optimizing Spatiotemporal Sampling for k-t BLAST and k-t SENSE: Application to High-Resolution Real-Time Cardiac Steady-State Free Precession", Magn. Reson. Med. vol. 53 pages 1372-82 (2005), although other patterns or k-space trajectories are also contemplated. The illustrative example of FIG. 12 has a net acceleration factor of 6.4, with full sampling in all time frames for the centermost 5 lines (central k-space region 72). The next-outer 21 lines (intermediate k-space region 74) are acquired with reduction factor of 3. The locations of the 21 lines are periodically in a pattern having a temporal period of three adjacent time frames. The outermost lines (outer k-space region 76) has reduction factor 10.

Figure 14:
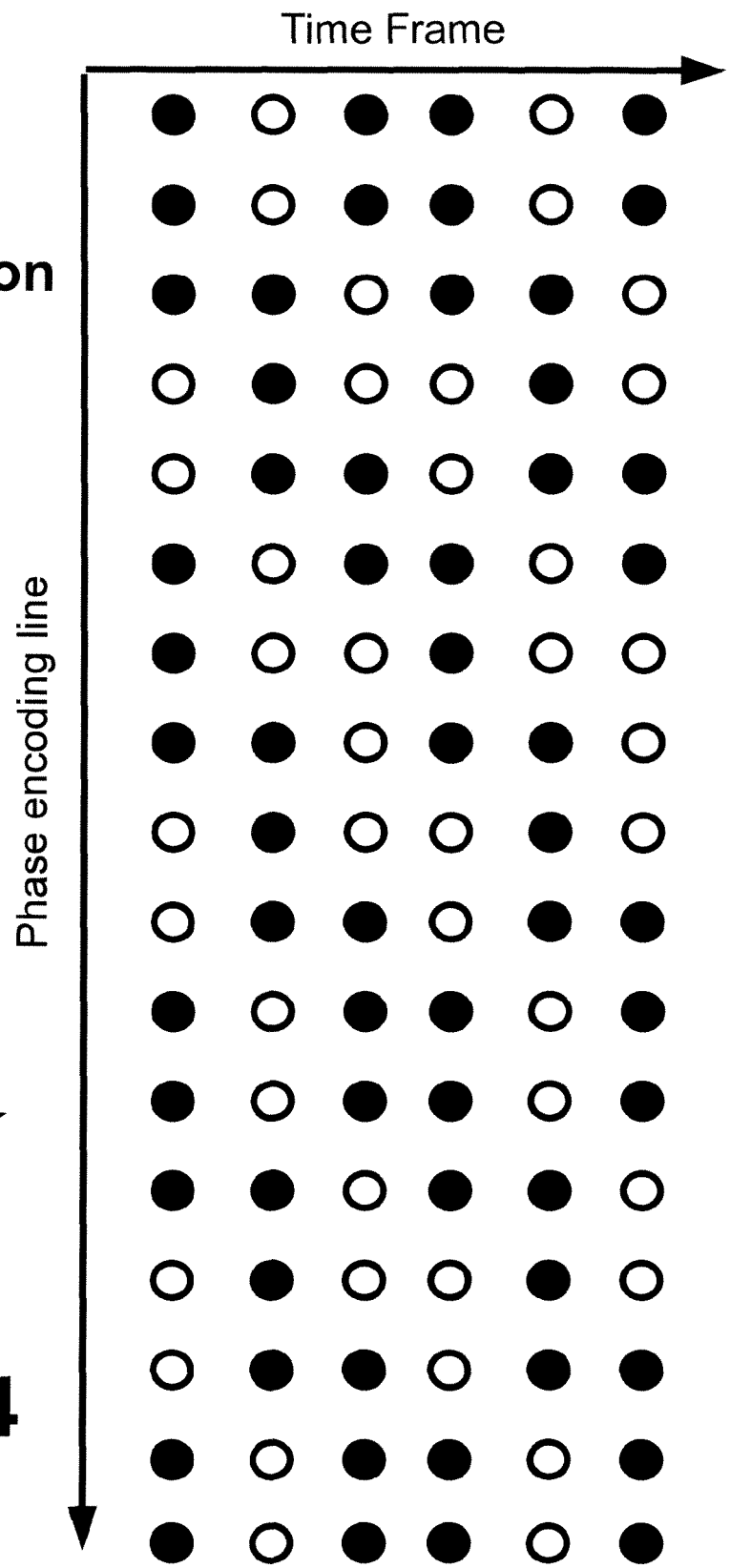
Figure 15:
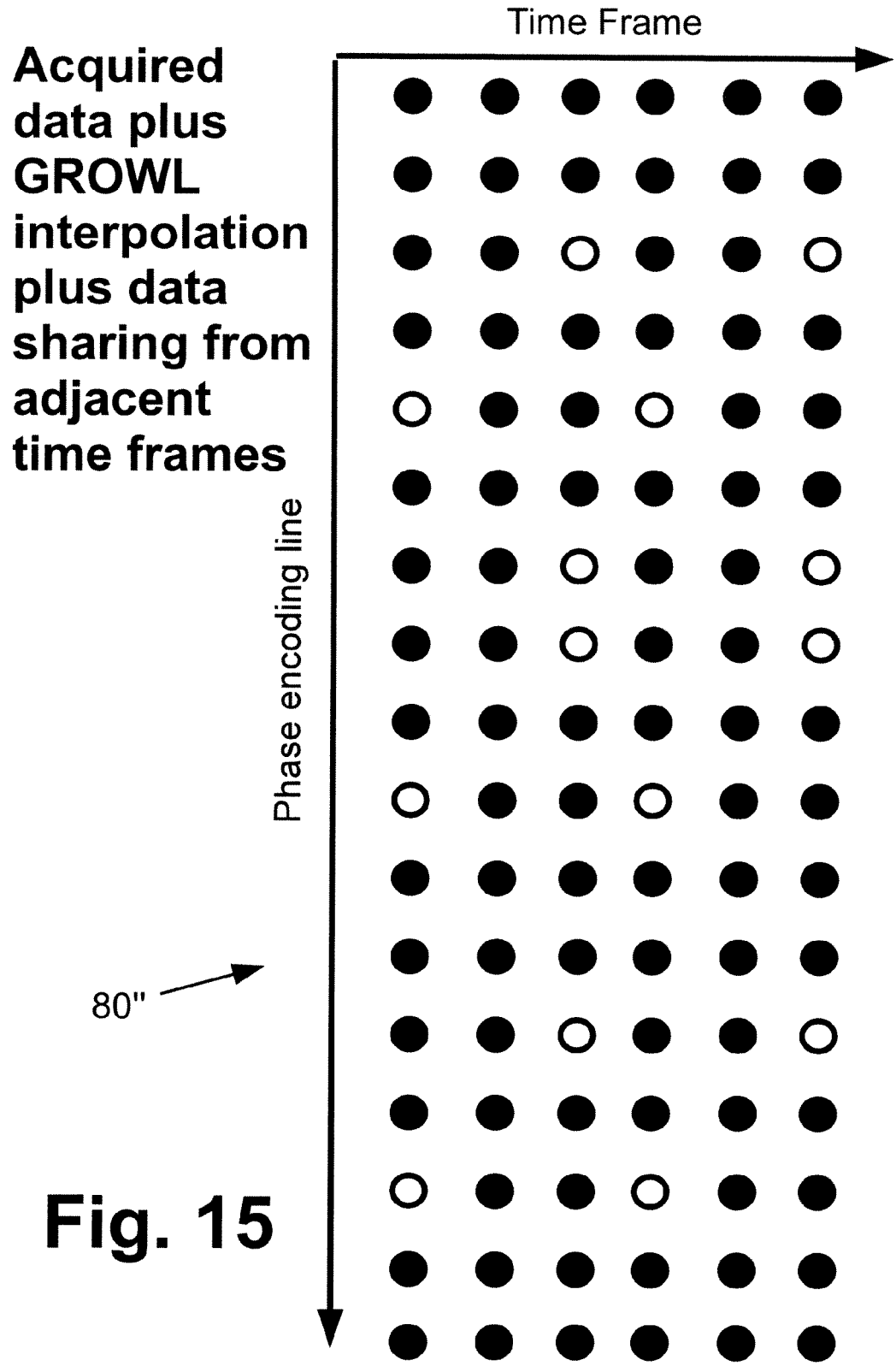
Figure 16:
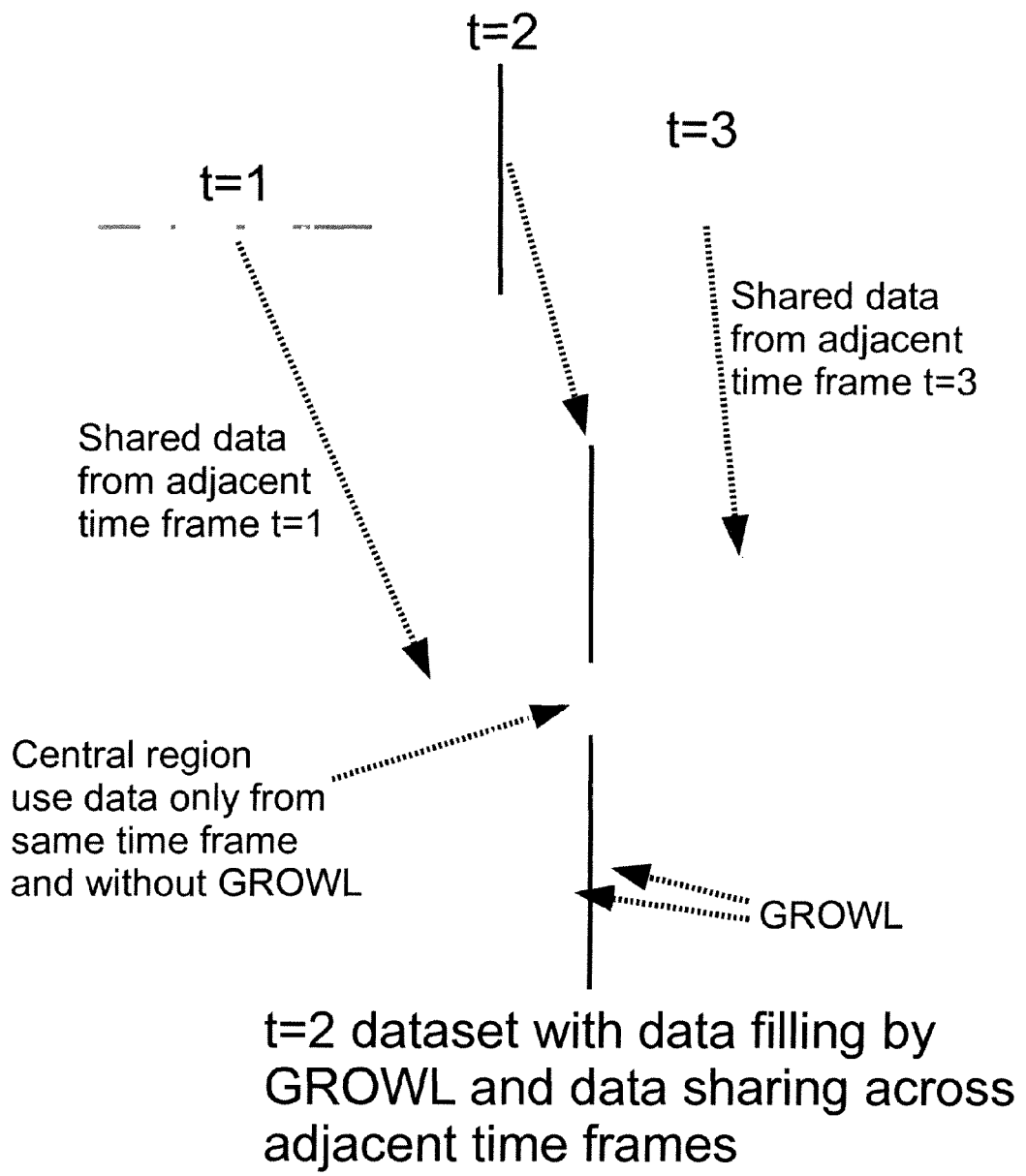

In the dynamic MR imaging approach of FIGS. 12-17, GROWL is used to accurately extrapolate k-space lines, and hence reduce the acceleration factor for temporal filtering. Here GROWL is used across the time dimension. Examples are shown for Cartesian sampling (FIGS. 13-15) and for radial sampling (FIG. 16).

Figure 13:
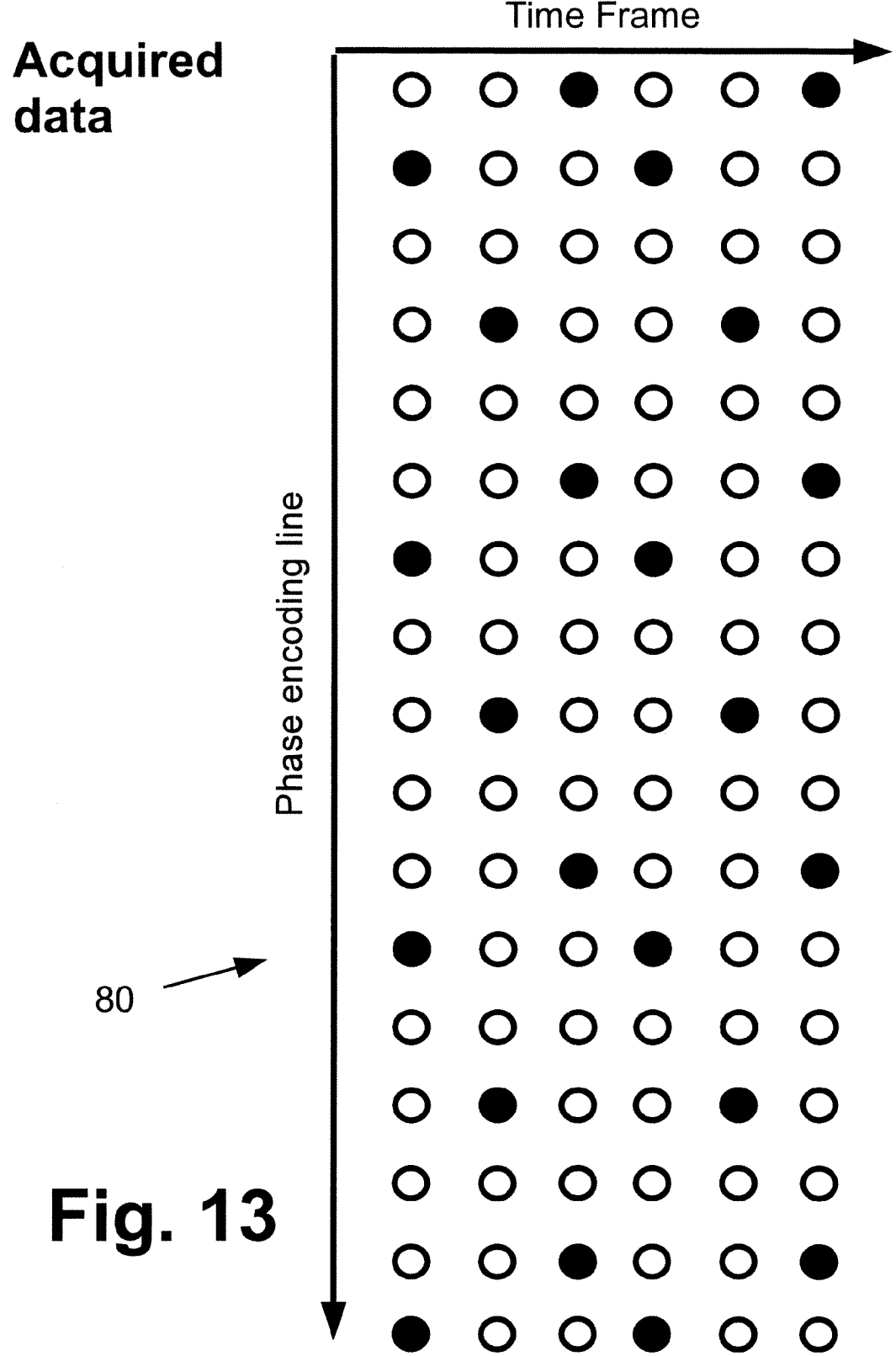

FIGS. 13-15 illustrate a Cartesian sampling example. FIG. 13 shows an illustrative k-t MR-PPI dataset 80 as acquired by the MR-PPI acquisition sub-module 16 (referring back FIG. 1). Acquired samples are shown by filled circles while missing (i.e. unacquired) samples are shown by unfilled circles. FIG. 13 shows two periods (i.e., six time frames) of the temporally varying acquisition pattern having a three time period periodicity.

FIG. 14 shows an enhanced k-t dataset 80' comprising the acquired samples and additional missing samples that have been filled in by GROWL, using filled circles to indicate the samples added by GROWL. After GROWL, the reduction factor is reduced 3 times.

FIG. 15 shows an further enhanced k-t dataset 80" after an optional further fill-in operation in which further missing samples are filled in by data sharing between adjacent time frames. In FIG. 15 the samples filled in by data sharing across time frames are also indicated by filled circles.

FIG. 16 shows a radial acquisition example. Specifically, FIG. 16 shows a time frame denoted t=2, in which the acquired k-t MR-PPI dataset a single line (vertically oriented in FIG. 16), and is augmented by GROWL and by data sharing from the adjacent t=1 and t=3 time frames. Sampling between each successive time frame operates in a different radial direction so that the data sharing between radial acquisition time frames provides substantial acceleration. Again, data in a central k-space region including k=0 is sampled in every time frame to provide fully sampled data for self-calibration of the GROWL. Acceleration is substantial, as the single (vertical) k-space line acquired in the t=2 time frame is increased to 5 lines (two vertical lines added by GROWL and two orthogonal lines added by optional time sharing from the adjacent t=1 and t=3 time frames). If the optional time sharing is omitted, then the acceleration is three times (one acquired line plus two additional lines generated by GROWL).

A suitable dynamic imaging approach employing the data filling as described by illustrative Cartesian and radial dataset examples of FIGS. 13-16 proceeds as follows. First, image support reduction is performed to enhance the accuracy of GROWL. A suitable approach is to subtract the mean k-space (along temporal direction) from each time frame at corresponding required locations. GROWL is then performed for each time frame. This entails extending each line to be three lines (more generally, the extension may be to more or fewer than three lines depending upon the kernel size used in GROWL). The kernel can be either self-calibrated using a fully sampled central k-space region 72, as in the examples, or can be calculated using pre-scan sensitivity maps. This GROWL data fill-in is suitably performed by the operation 32 (see FIG. 1).

Optionally, further data fill-in is provided by data sharing with adjacent time frames. (This corresponds to the data fill-in shown in FIG. 15 for Cartesian data, or by the t=1 and t=3 time frame data in the radial dataset example of FIG. 16). High frequency information from adjacent time frames can be shared without substantial influence on the temporal resolution, so as to further reduce the acceleration factor.

The k-t dataset with at least some missing data filled in by GROWL and optionally by time sharing across time frames is then processed by an iterative algorithm performing temporal filtering to fill in at least some missing data. This iterative algorithm is suitably implemented as the reconstruction algorithm 34 (see FIG. 1). Various temporal filtering algorithms can be employed, such as k-t PCA, k-t BLAST, k-t FOCUSS, k-t SPARSE, k-t GRAPPA, or so forth. In some embodiments k-t FOCUSS is employed. See, e.g. Jung et al., "k-t FOCUSS: A general compressed sensing framework for high resolution dynamic MRI", Magnetic Resonance in Medicine vol. 61 pp. 103-116 (2009)). This is followed by image support compensation, suitably implemented by adding the mean k-space back to each time frame. A convolution in k-space is also optionally performed, suitably using a small kernel, e.g. of kernel size 5×1 or 7×1. Only the data interpolated using temporal filtering use the results of the optional convolution.

Figure 17:
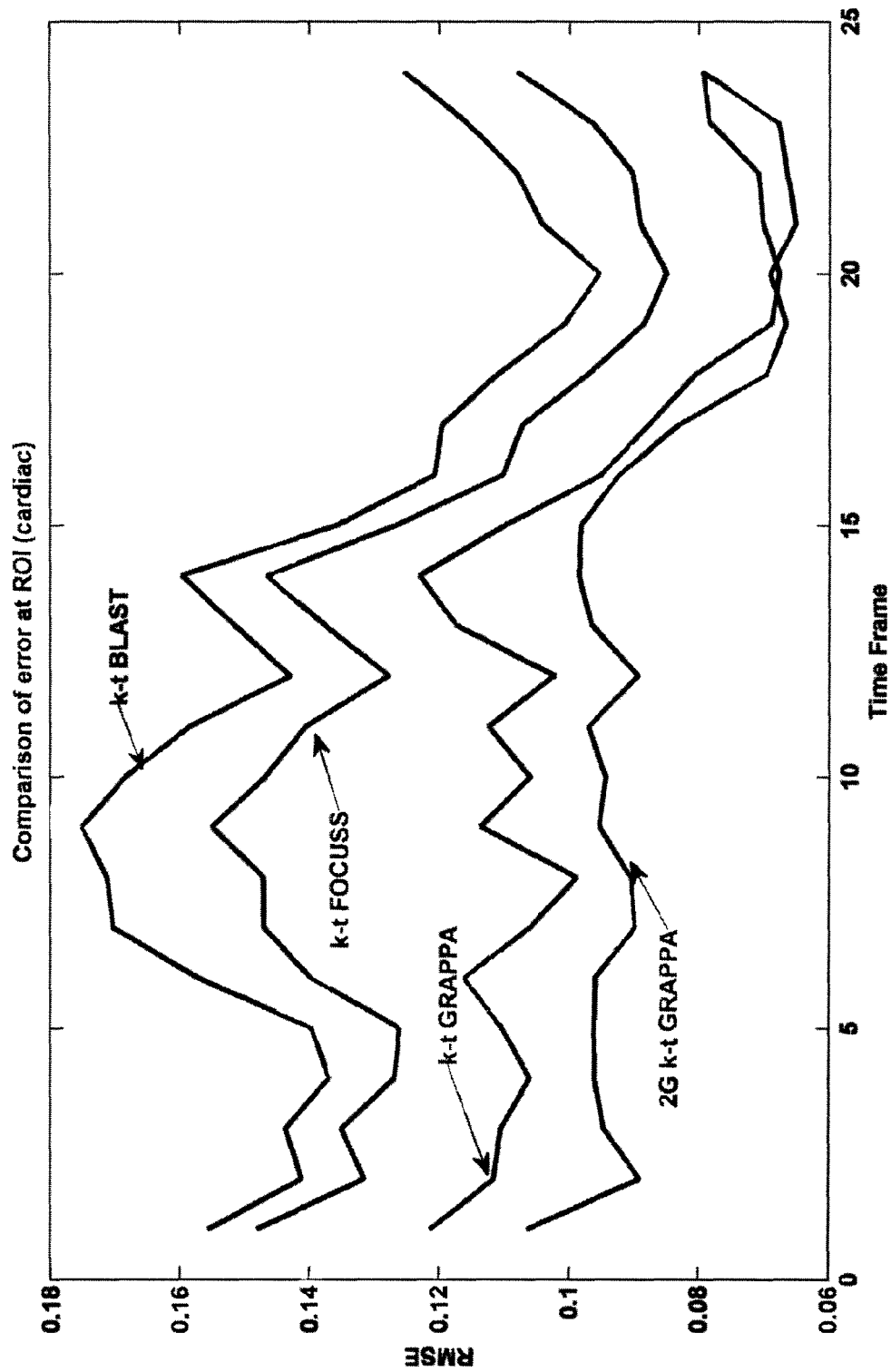

With reference to FIG. 17, the disclosed k-t MR-PPI imaging can be applied for acquiring a real-time image and/or dynamic imaging with arbitrary trajectories. An illustrative example is cardiac cine imaging, in which the size of the data set is 160×256×24 (channel)×24 (time frames). FIG. 17 shows the comparison of accuracy (as measured by root mean square error, RMSE, at the cardiac region of interest, for a net reduction factor of 5.

This application has described one or more preferred embodiments. Modifications and alterations may occur to others upon reading and understanding the preceding detailed description. It is intended that the application be construed as including all such modifications and alterations insofar as they come within the scope of the appended claims or the equivalents thereof.

The invention claimed is:

1. A method comprising:
    acquiring an undersampled magnetic resonance partially parallel imaging (MR-PPI) dataset using a plurality of radio frequency receive coils,
    wherein the dataset includes a central k-space region including k=0 that is not undersampled, an intermediate k-space region surrounding the central k-space region that is undersampled at a first acceleration factor R1, and an outer k-space region surrounding the intermediate k-space region that is undersampled at a second acceleration factor R2 where R2>R1; and
    reconstructing the undersampled MR-PPI dataset to generate a reconstructed magnetic resonance (MR) image, the reconstructing including:
        (i) using a generalized auto-calibrating partially parallel acquisition (GRAPPA) operator or direct convolution to fill in at least some missing data of the undersampled MR-PPI dataset so as to generate an enhanced dataset comprising the undersampled MR-PPI dataset and missing data that is filled in by the operation (i), and
        (ii) using an algorithm other than a GRAPPA operator and other than direct convolution to reconstruct the enhanced dataset or to reconstruct the undersampled MR-PPI dataset using the enhanced dataset as an initialization dataset for an iterative reconstruction algorithm.

2. The method of claim 1, wherein R1=2 and the intermediate k-space region has a checkerboard undersampling pattern.

3. The method of claim 1, wherein the operation (i) uses a GRAPPA operator or direct convolution and employs the central k-space region that is not undersampled as self-calibration data.

4. The method of claim 3, wherein the operation (ii) comprises an iterative reconstruction that reconstructs the enhanced dataset comprising the undersampled MR-PPI dataset and missing data that is filled in by the operation (i).

5. The method of claim 3, wherein the operation (ii) comprises an iterative reconstruction that reconstructs the undersampled MR-PPI dataset and uses the enhanced dataset comprising the undersampled MR-PPI dataset and missing data that is filled in by the operation (i) for initializing the iterative reconstruction.

6. The method of claim 1, wherein the operation (ii) employs compressed sensing to reconstruct a dataset comprising one of:
    the undersampled MR-PPI dataset, and
    the enhanced dataset comprising the undersampled MR-PPI dataset and missing data that is filled in by the operation (i).

7. The method of claim 1, wherein:
    the dataset comprises an undersampled k-t MR-PPI dataset, and
    the acquiring comprises acquiring the undersampled k-t MR-PPI dataset over a plurality of time frames.

8. The method of claim 7, wherein the undersampling of the intermediate k-space region includes using different sampling of the intermediate k-space region in adjacent time frames.

9. The method of claim 7, wherein the operation (i) fills in missing data of the undersampled intermediate k-space region using a GRAPPA operator or direct convolution and employs the central k-space region that is not undersampled as self-calibration data.

10. The method of claim 9, wherein the operation (ii) employs at least the intermediate k-space region with missing data filled in by the operation (i) as self-calibration data.

11. The method of claim 7, wherein the operation (ii) employs k-t FOCUSS to fill in some but not all missing data of the undersampled MR-PPI dataset.

12. The method of claim 1, wherein:
the acquiring comprises acquiring an undersampled non-Cartesian MR-PPI dataset,
wherein the dataset includes a central k-space region including k=0 that is not undersampled, an intermediate k-space region surrounding the central k-space region that is undersampled at a first acceleration factor R1, and an outer k-space region surrounding the intermediate k-space region that is undersampled at a second acceleration factor R2 where R2>R1; and
the operation (i) comprises using a GRAPPA operator for wider radial bands (GROWL) to fill in some but not all missing data of the undersampled non-Cartesian MR-PPI dataset.

13. A method comprising:
acquiring an undersampled non-Cartesian magnetic resonance partially parallel imaging (MR-PPI) dataset using a plurality of radio frequency receive coils,
wherein the dataset includes a central k-space region including k=0 that is not undersampled, an intermediate k-space region surrounding the central k-space region that is undersampled at a first acceleration factor R1, and an outer k-space region surrounding the intermediate k-space region that is undersampled at a second acceleration factor R2 where R2>R1; and
reconstructing the undersampled non-Cartesian MR-PPI dataset to generate a reconstructed magnetic resonance (MR) image, the reconstructing using a generalized auto-calibrating partially parallel acquisition (GRAPPA) operator for wider radial bands (GROWL) to fill in at least some missing data of the undersampled non-Cartesian MR-PPI dataset.

14. The method of claim 13, wherein the reconstructing includes filling in a sample using GROWL by (1) identifying a point on a Cartesian grid proximate to an acquired sample of the undersampled non-Cartesian MR-PPI dataset and (2) interpolating samples of the undersampled non-Cartesian MR-PPI dataset proximate to the identified point on the Cartesian grid to determine a value for the identified point on a Cartesian grid.

15. The method of claim 13, wherein the acquiring comprises acquiring an undersampled non-Cartesian k-t MR-PPI dataset over a plurality of time frames, the undersampling being different in adjacent time frames to produce undersampling along the time dimension, the reconstructing using GROWL to fill in at least some missing data due to the undersampling along the time dimension.

16. The method of claim 13, wherein the reconstructing additionally uses an algorithm other than GROWL to fill in at least some missing data of the undersampled non-Cartesian MR-PPI dataset.

17. The method of claim 1, further comprising:
displaying the reconstructed MR image on a display device.

18. An apparatus comprising:
a magnetic resonance scanner;
a plurality of radio frequency receive coils; and
a data processing device configured to cooperate with the MR scanner and the radio frequency receive coils to perform a method as set forth in claim 1.

19. A non-transitory, computer readable storage medium storing instructions executable by a magnetic resonance imaging system to perform a method as set forth in claim 1.

* * * * *